(12) United States Patent
van Veldhoven et al.

(10) Patent No.: US 8,427,350 B2
(45) Date of Patent: Apr. 23, 2013

(54) SIGMA-DELTA MODULATOR

(75) Inventors: Robert Henrikus Margaretha van Veldhoven, Dommelen (NL); Lucien Johannes Breems, Eindhoven (NL); Robert Rutten, Uden (NL)

(73) Assignee: NXP B.V., Eindhoven (NL)

( * ) Notice: Subject to any disclaimer, the term of this patent is extended or adjusted under 35 U.S.C. 154(b) by 95 days.

(21) Appl. No.: 13/125,104

(22) PCT Filed: Oct. 21, 2009

(86) PCT No.: PCT/IB2009/054643
§ 371 (c)(1),
(2), (4) Date: Apr. 20, 2011

(87) PCT Pub. No.: WO2010/046859
PCT Pub. Date: Apr. 29, 2010

(65) Prior Publication Data
US 2011/0199247 A1 Aug. 18, 2011

(30) Foreign Application Priority Data
Oct. 23, 2008 (EP) .................. 08105639

(51) Int. Cl.
*H03M 3/00* (2006.01)

(52) U.S. Cl.
USPC ........................ 341/143; 341/155

(58) Field of Classification Search .......... 341/143, 341/155
See application file for complete search history.

(56) References Cited

U.S. PATENT DOCUMENTS

| | | | |
|---|---|---|---|
| 5,550,544 A | 8/1996 | Sakiyama et al. | |
| 6,642,874 B1 | 11/2003 | Lin et al. | |
| 6,738,004 B2* | 5/2004 | Melanson | 341/143 |
| 6,744,392 B2* | 6/2004 | Melanson | 341/143 |
| 6,864,818 B1 | 3/2005 | Hezar | |
| 6,885,330 B2* | 4/2005 | Trotter et al. | 341/152 |
| 7,362,252 B1* | 4/2008 | Pai | 341/143 |
| 2004/0032355 A1* | 2/2004 | Melanson | 341/143 |
| 2005/0052304 A1* | 3/2005 | Trotter et al. | 341/152 |
| 2005/0093726 A1 | 5/2005 | Hezar et al. | |
| 2006/0028364 A1* | 2/2006 | Rivoir | 341/143 |
| 2006/0164272 A1* | 7/2006 | Philips et al. | 341/143 |
| 2006/0187103 A1* | 8/2006 | Welser et al. | 341/155 |
| 2007/0035427 A1 | 2/2007 | Schreier et al. | |
| 2008/0100486 A1 | 5/2008 | Lin | |

FOREIGN PATENT DOCUMENTS

| | | |
|---|---|---|
| EP | 1 684 421 A1 | 7/2006 |
| WO | 97/26708 A1 | 7/1997 |

OTHER PUBLICATIONS

Breems, L., et al. "A Cascaded Continuous-Time ΣΔ Modulator with 67-dB Dynamic Range in 10MHz Bandwidth", IEEE J. of Solid-State Circuits, vol. 39, No. 12, pp. 2152-2160 (Dec. 2004).

Yuan, X., et al. "On Low Power Design of Feedforward Continuous-Time Sigma Delta Modulators with Excess Loop Delay", IEEE Circuits & Systems, pp. 1882-1885 (May 18, 2008).

(Continued)

*Primary Examiner* — Jean B Jeanglaude

(57) ABSTRACT

A sigma-delta modulator (400) 400, 500, 600) for converting an input signal (X(s)) (X(s)) to a quantized output signal (Y(z)) (Y(z)), in which a feedback loop is provided between a filter (402) and a quantizer (403) of the modulator, the feedback loop configured to reduce quantization errors from the modulator by filtering and subtracting quantization noise fed back to an input of the quantizer (403).

2 Claims, 5 Drawing Sheets

OTHER PUBLICATIONS

International Search Report and Written Opinion for Int'l. Patent Application No. PCT/IB2009/054643 (Feb. 9, 2010).

Norsworthy, "Delta-Sigma Data Converters: Theory, Design and Simulation", section 3.2, "Basic Structures and Terminology", IEEE Press, cover, copyright pg., pp. 78-80 (1997).

* cited by examiner

SIGMA-DELTA MODULATOR

TECHNICAL FIELD OF THE INVENTION

The invention relates to sigma-delta (ΣΔ) modulators, and in particular to aspects of noise shaping in ΣΔ modulators.

BACKGROUND ART

Sigma-delta modulators (also known as delta-sigma modulators) are well-known in certain types of analog to digital (ADC) architectures. A ΣΔ modulator exploits the effects of oversampling to shape quantization errors spectrally, allowing these errors to be effectively moved to higher frequencies where they can be more easily filtered out. An example of a ΣΔ modulator is illustrated in schematic block diagram form in FIG. 1. The modulator 100 comprises an adder 101, a loop filter H 102, a quantizer or analog/digital converter Q 103, and a feedback path 104 having a digital/analog converter 105. Both the quantizer 103 and the feedback loop DAC 105 operate at a sampling frequency $f_s$ supplied by a clock signal. An input signal X(s) is converted to an output signal Y(z). The feedback path 104 allows the quantized signal Y(z) to be compared with the input signal X(s), resulting in an output signal that comprises a quantized signal overlaid with a quantisation error, which may alternatively be described as quantization noise. Such types of modulators are described in more detail by Norsworthy et al., in 'Delta-Sigma Data Converters; Theory, Design, and Simulation', IEEE press, 1997.

FIG. 1b shows the modulator of FIG. 1a with the components represented in transfer function form. The quantizer 103 is modelled by a summing node 103a where quantization noise Q is introduced. The transfer function for the modulator is then given by:

$$Y = X \frac{H}{1+H} + Q \frac{1}{1+H}$$

Depending on the implementation of the loop filter 102, the quantization noise can be suppressed in a specified part of the output spectrum of Y(z). The more bits are chosen for the quantizer 103 and the feedback path 104, the lower the quantization noise in the output signal Y(z) will tend to be, because the quantization errors made will be smaller. A ΣΔ modulator 100 can be implemented in several ways. One implementation is a fully digital ΣΔ modulator, where the input signal X is a digital signal, which is to be transformed into an output signal Y having a reduced number of bits. To do this involves rounding of the input signal by the quantizer 103, which introduces a quantization error. This error can be controlled using feedback, resulting in the output signal Y being a controlled copy of X, with a gain applied by the loop filter H.

Another implementation is a ΣΔ analog to digital converter, in which the input signal X(s) is a time-continuous analog signal, to be converted into a discrete signal Y(z) in the digital domain. This can be implemented in several ways. The loop filter 102 can be implemented with switched capacitors or continuous time filters, both of which have associated advantages and disadvantages. The quantizer 103 digitises the signal from the loop filter 102. The output signal Y(z) is fed back through a digital to analog converter 104, which converts the digital signal into an analog representation, which is then compared to the analog input signal X(s) by the adder/comparator 101. An advantage of this type of ADC is that of the noise shaping behaviour of the loop filter 102.

Several architectures are known to improve the noise-shaping characteristic of ΣΔ modulators. One of those is a multi-stage noise-shaping ADC, also known as a MASH or cascaded ΣΔ ADC, for example as disclosed by Breems, et al., in "A Cascaded Continuous-Time ΣΔ Modulator with 67 Dynamic Range in 10 MHz Bandwidth", IEEE Journal of Solid-State Circuits, Vol. 39, pp. 2152-2160, December 2004. An example of such a MASH ADC 200 is illustrated in FIG. 2. The converter 200 consists of multiple ΣΔ modulator stages, each having an adder 211, 221, a loop filter 212, 222, a quantizer 213, 223 and a feedback loop having a digital to analog converter 214, 224 as in the modulator of FIG. 1. In the example shown in FIG. 2 the ADC has two stages. The first stage 210 converts the input signal $X_1(s)$ into a digital domain signal $Y_1(z)$. The second stage 220 converts the quantization error $X_2(s)$ of the first stage 210, amplified by amplifier 240 having a transfer function G, into a second digital domain signal $Y_2(z)$, which is then subtracted from $Y_1(z)$ by the noise cancellation filter 230. The noise cancellation filter 230 includes delay and filter compensation to accurately subtract the quantization error of the first stage 210 from the output $Y_1(z)$, producing a quantized signal $X_1(z)$. The quantization error $X_2(s)$ of the first stage 210 is defined as the difference between the input and output signals of the quantizer 213. However, a DAC 215 is needed to convert the digital output signal $Y_1(z)$ of the quantizer 213 into an analog representation for combining at a further adder 216 to produce the input signal $X_2(s)$ for the second stage 220. The additional DAC 215 adds to the complexity and cost of an integrated circuit incorporating the features of the ADC, as well as subjecting the error signal $X_2(s)$ to absolute gain variations. The DAC 215 also requires close matching of analog components to function properly.

A further problem with the above mentioned implementation of aΣΔ ADC is that the quantization error output by a conventional ΣΔ modulator is still present and therefore needs to be removed or minimised by further processing.

OBJECT OF INVENTION

It is an object of the invention to address one or more of the above mentioned problems.

SUMMARY OF INVENTION

In accordance with the invention there is provided a sigma-delta modulator for converting an input signal to a quantized output signal, the modulator comprising:
  a first adder configured to receive the input signal at a first input;
  a first filter configured to receive an output signal from the first adder;
  a quantizer configured to receive an output signal from the first filter and provide the quantized output signal;
  a first feedback loop between the output of the quantizer and a second input of the first adder, the feedback loop comprising a first digital to analog converter; and
  a second feedback loop comprising a second adder connected between the output of the first filter and the input of the quantizer, the second feedback loop configured to compensate for a quantization error by suppressing quantization noise introduced by the quantizer.

The second feedback loop may be connected between the output and the input of the quantizer and may comprise:
  a second digital to analog converter configured to receive the output signal of the quantizer;
  a third adder configured to receive an output signal from the second digital to analog converter; and a second filter configured to receive an output signal from the second adder, a first input of the second adder configured to receive the output of the first filter, a second input of the second adder configured to receive the output from the second filter, an output of the second adder connected to the input of the quantizer and to a second input of the third adder.

The filter in the second feedback loop optionally has unity gain in at least a part of the spectrum in which quantization noise is suppressed.

The second feedback loop of the sigma-delta modulator according to the invention may alternatively comprise:
a third adder configured to receive the input signal;
a second filter configured to receive an output signal from the third adder; and
a third filter configured to receive the output from the first digital to analog converter,
a first input of the second adder configured to receive the output of the first filter, a second input of the second adder configured to receive the output from the second filter, a third output of the second adder configured to receive an output from the third filter, an output of the second adder connected to the input of the quantizer and to a second input of the third adder.

The second feedback loop of the sigma-delta modulator according to the invention may alternatively comprise:
a third adder configured to receive the input signal;
a second filter configured to receive an output signal from the second adder; and
a third filter configured to receive the output from the first adder, a first input of the second adder configured to receive the output of the first filter, a second input of the second adder configured to receive the output from the second filter, a third output of the second adder configured to receive an output from the third filter, an output of the second adder connected to the input of the quantizer and to a second input of the third adder.

In a general aspect, disclosed herein is sigma-delta modulator for converting an input signal to a quantized output signal, in which a feedback loop is provided between a filter and a quantizer of the modulator, the feedback loop configured to reduce quantization errors from the modulator by filtering and subtracting quantization noise fed back to an input of the quantizer.

Embodiments of the invention will now be described by way of example, with reference to the appended drawings in which:

FIG. 1b is a transfer function representation of the modulator of FIG. 1a;

FIG. 4b is a transfer function representation of the modulator of FIG. 4a;

FIG. 5b is a transfer function representation of the modulator of FIG. 5a;

FIG. 6b is a transfer function representation of the modulator of FIG. 6a.

SPECIFIC DESCRIPTION OF THE EMBODIMENTS

Figure 1A:
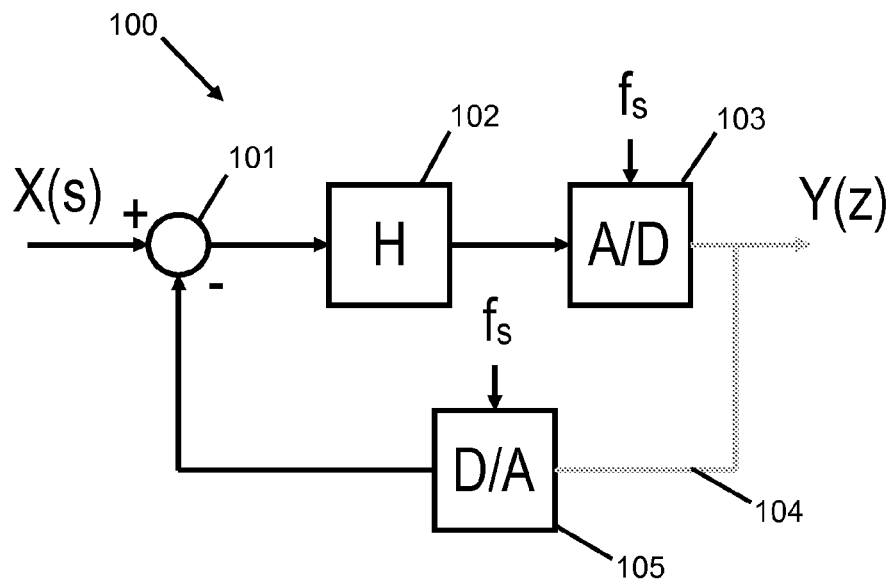
FIG. 1a is a block diagram of an exemplary known ΣΔ modulator.
Figure 1B:
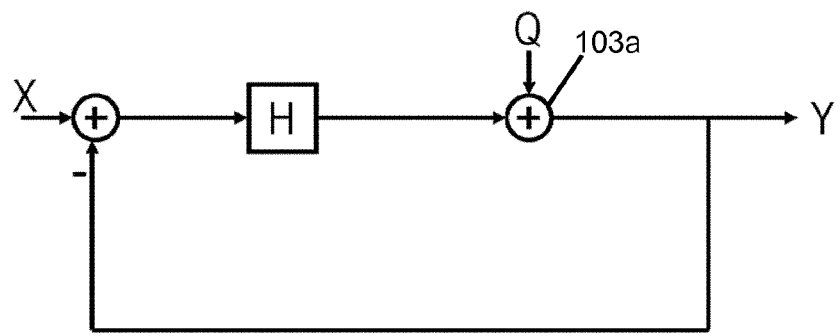
Figure 2:
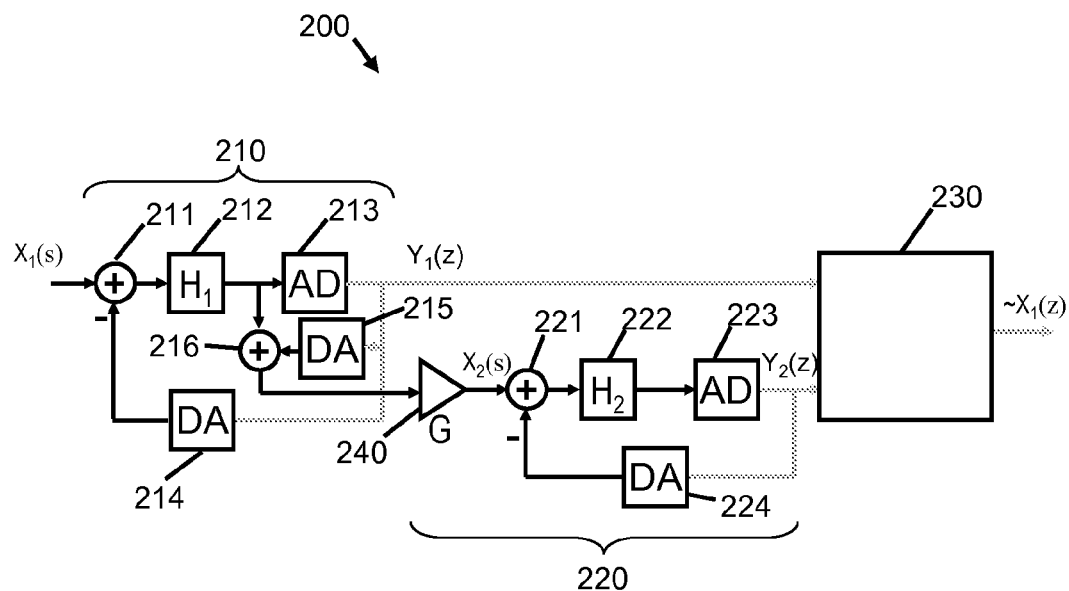
FIG. 2 is a block diagram of a MASH ΣΔ modulator.

The modulators illustrated in FIGS. 1 and 2 have already been described as part of the background to the invention above.

Figure 3:
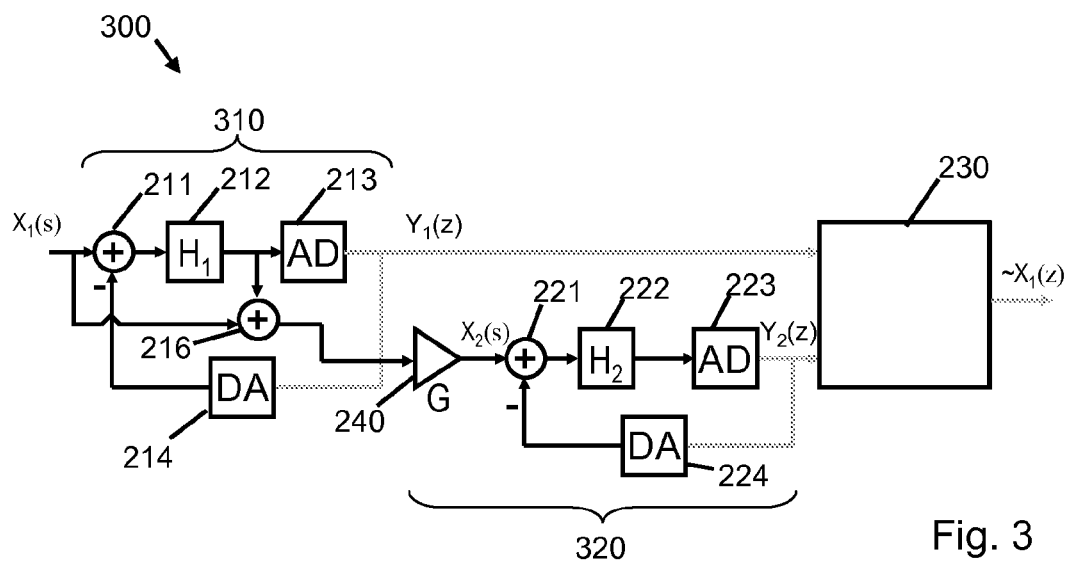
FIG. 3 is a block diagram of an alternative MASH ΣΔ modulator.

Shown in FIG. 3 is a block diagram illustration of a cascaded sigma-delta analog to digital converter 300. Most of the components of the first stage 310, the second stage 320 and the noise filter 230 of the converter 300 are as previously described with reference to the converter 200 shown in FIG. 2. A difference between the ADC in FIG. 2 and that shown in FIG. 3 is that the DAC 215 in FIG. 2 that is needed to generate the quantization error has been eliminated. In place of this, one input of the summing node or adder 216 is connected to the output of the loop filter 212 of the first stage 210. The quantization error fed to the second stage 320 is derived from the difference between the input signal X1(s) and the loop filtered signal, which incorporates a contribution from the feedback loop.

An advantage of the modulator of FIG. 3 is that of being able to eliminate one of the DACs used in the ADC. This saves on the number of active components required in an integrated circuit implementation. Subtraction using the adder 216 to obtain the error signal $X_2(s)$ can also be carried out more accurately, as this does not rely on the accuracy of an additional conversion stage. A modulator according to the invention, illustrated in FIG. 4a, retains the DAC 215 shown in FIG. 2 and includes further adders and a filter to the ΣΔ modulator, in order to subtract quantization noise introduced by the quantizer 403 from the signal at the input of the quantizer 403. The modulator 400 comprises the components present in the modulator 100 shown in FIG. 1, i.e. an adder 401 receiving the input signal X(s) and a signal from a feedback loop comprising DAC 404, a loop filter 402 and a quantizer 403, resulting in an output signal Y(z). The modulator 400 further includes an additional noise-shaping coder in the main loop, comprising a DAC 415, a summation node 405 and a filter 406. This additional loop feeds the quantization error back into the main loop of the modulator 400 via a further summation node 407 between the output of the loop filter 402 and the input of the quantizer 403.

Figure 4A:
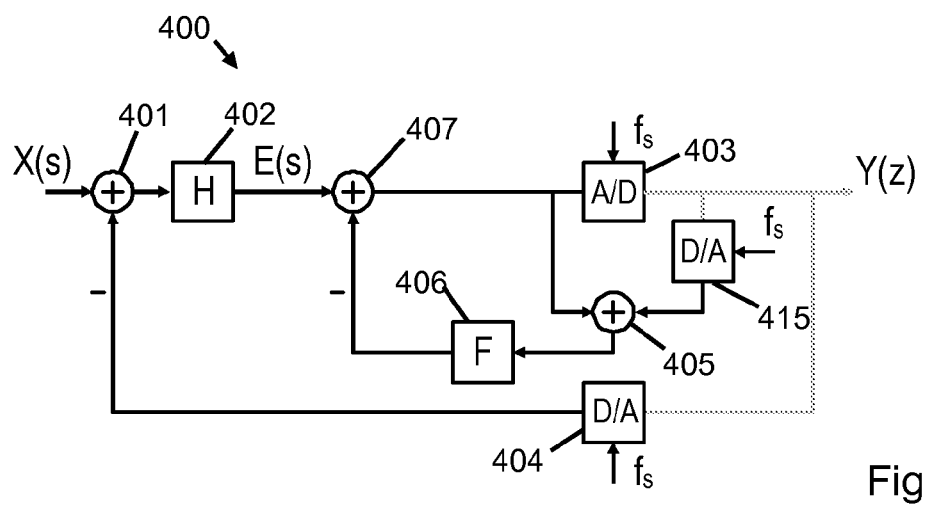
FIG. 4a is a block diagram of an alternative ΣΔ modulator according to the invention.
Figure 4B:
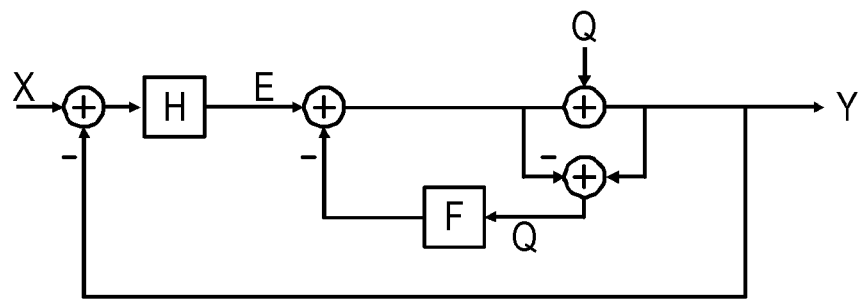

A transfer function of the input signal X and the quantization error Q to the output Y can be calculated by modelling the quantizer 403 with a quantization noise source Q and a gain of 1, with the feedback path modelled by a gain of 1. This transfer function representation of the modulator 400 of FIG. 4a is illustrated in FIG. 4b. A first transfer function provides the output signal Y in terms of the intermediate signal E from the loop filter:

$$Y = E + Q(1-F) \quad (1)$$

This relationship shows that the input signal E is directly transferred to the output signal Y without being filtered or changed by the second loop. The overall stability of the modulator loop is thereby not compromised. The quantization error Q is, however, modified with a factor (1−F). A second transfer function provides the output signal in terms of the input signal X:

$$Y = X\frac{H}{1+H} + Q\frac{1-F}{1+H} \quad (2)$$

The original shaping behaviour of the loop filter 402, represented by function H, is unchanged and still reduces the quantization error Q by a factor of 1−F in the part of the frequency spectrum where H has gain.

If, in the second loop, the filter 406 has a gain of 1, the quantization error can be fully cancelled at the output Y. The filter 406 preferably has a gain of 1 in at least a part of the frequency spectrum in which quantization noise introduced by the quantizer 403 is to be suppressed. The filter 406 may have the characteristics of a low, high or bandpass transfer function.

The embodiment of FIGS. 4a and 4b can be implemented in the analog, digital or mixed analog/digital domain.

Figure 5A:
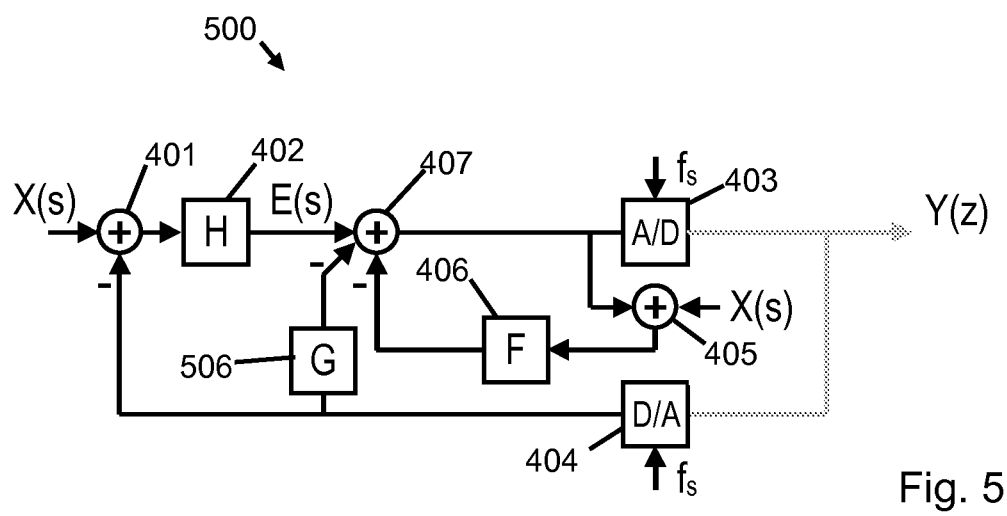
FIG. 5a is a block diagram of a further alternative ΣΔ modulator according to the invention.
Figure 5B:
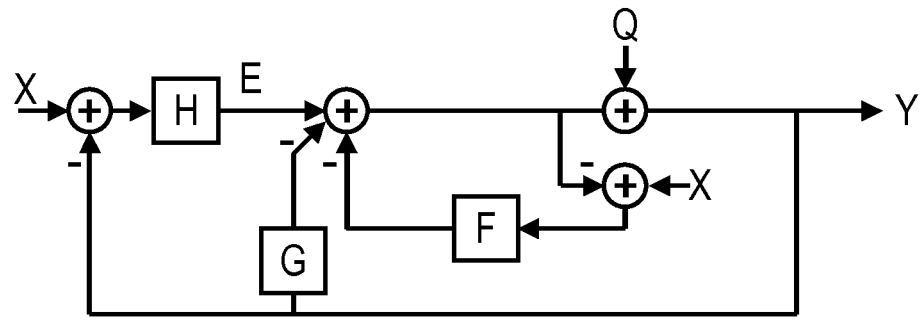

An alternative implementation of the invention is shown in FIG. 5a, with the equivalent transfer function representation shown in FIG. 5b. The first input of the summing node 405, which calculates the quantization error, now receives the input signal X(s). The DAC 415 (FIG. 4a) is not therefore required, enabling the subtraction operation to be carried out more accurately, because the eliminated DAC is subject to absolute gain variations and requires good matching between analog components. A further filter 506, having a transfer function G, is connected between the output of DAC 404 and a third input of adder 407. The transfer function of the output signal in terms of the intermediate signal E(s) from the loop filter 402 is then given by:

$$Y = E\frac{1}{1-F+G} + Q\frac{1-F}{1-F+G} + X\frac{-F}{1-F+G} \quad (3)$$

The transfer function of the output signal in terms of the input signal in then given by:

$$Y = X\frac{H-F}{1+H+G-F} + Q\frac{1-F}{1+H+G-F} \quad (4)$$

From equation 3 it can be seen that if G is chosen to be equal to F, the stability of the loop is still determined by the original loop filter H 402, and the stability of the modulator 500 is not compromised. The shaping of the quantization noise function Q has not changed compared to the previous embodiment shown in FIGS. 4a and 4b and described above.

Figure 6A:
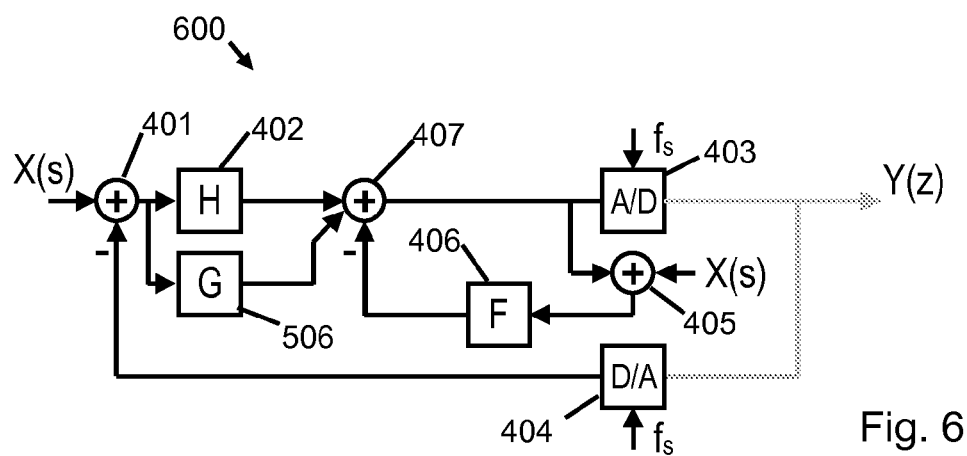
FIG. 6a is a block diagram of a further alternative ΣΔ modulator according to the invention.
Figure 6B:
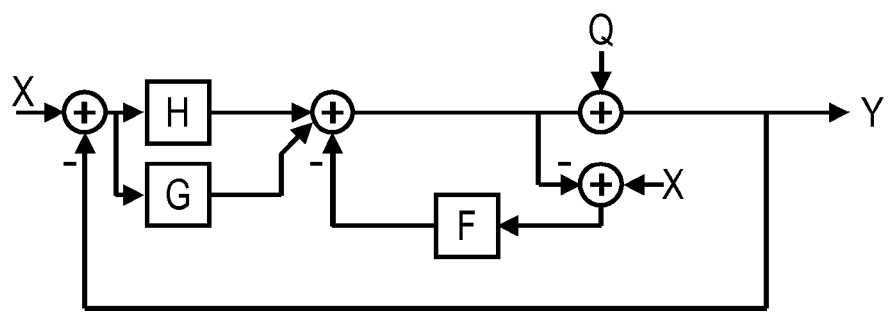

An alternative embodiment to that of FIGS. 5a and 5b is shown in FIGS. 6a and 6b, in which the filter 506 having transfer function G is connected instead to the output of the first summing node 401 in parallel to filter 402 having transfer function H. In this way, filter 506 operates completely in the analog domain, and only 1 feedback DAC is required.

When the transfer functions F and G of filters 406, 506 are made equal, the input signal X passes through the modulator 600 with a factor of one, if H has high gain. The quantization noise Q introduced by quantizer 403 is still suppressed by filter 402 and also by filter 406 when G is close to or equal to F. If F is close to 1, filter 506 together with loop filter 402 determines the stability of the modulator 500.

Other embodiments are intentionally within the scope of the invention as defined by the appended claims.

The invention claimed is:

1. A sigma-delta modulator for converting an input signal to a quantized output signal, the modulator comprising:
   a first adder configured to receive the input signal at a first input;
   a first filter configured to receive an output signal from the first adder;
   a quantizer configured to receive an output signal from the first filter and provide the quantized output signal;
   a first feedback loop between the output of the quantizer and a second input of the first adder, the first feedback loop comprising a first digital to analog converter; and
   a second feedback loop between an input of the quantizer and an input of a second adder connected between the output of the first filter and the input of the quantizer, the second feedback loop being configured to compensate for a quantization error by suppressing quantization noise introduced by the quantizer, wherein
   the second feedback loop comprises a third adder configured to receive the input signal;
   a second filter configured to receive an output signal from the third adder; and
   a third filter configured to receive one of the output from the first digital to analog converter and an output of the first adder,
   wherein a first input of the second adder is configured to receive the output of the first filter, a second input of the second adder is configured to receive the output from the second filter, a third input of the second adder is configured to receive an output from the third filter, an output of the second adder is connected to the input of the quantizer and to a second input of the third adder.

2. The sigma-delta modulator of claim 1, wherein the second filter has unity gain in at least a part of a spectrum in which quantization noise is suppressed.

\* \* \* \* \*